United States Patent
Benson

(10) Patent No.: US 8,786,368 B2
(45) Date of Patent: Jul. 22, 2014

(54) DISTRIBUTED AMPLIFIER WITH IMPROVED STABILIZATION

(75) Inventor: Keith Benson, Cambridge, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/385,772

(22) Filed: Mar. 6, 2012

(65) Prior Publication Data

US 2012/0229216 A1    Sep. 13, 2012

Related U.S. Application Data

(60) Provisional application No. 61/464,781, filed on Mar. 9, 2011.

(51) Int. Cl.
*H03F 3/60* (2006.01)
*H03F 1/22* (2006.01)
*H03F 1/08* (2006.01)

(52) U.S. Cl.
CPC .......... *H03F 3/607* (2013.01); *H03F 2200/153* (2013.01); *H03F 2200/108* (2013.01); *H03F 1/223* (2013.01); *H03F 2200/61* (2013.01); *H03F 2200/144* (2013.01); *H03F 1/086* (2013.01)
USPC ............................................. 330/286; 330/54

(58) Field of Classification Search
CPC .................................. H03F 3/605; H03F 3/607
USPC .................................. 330/286, 54, 295, 124 R
See application file for complete search history.

(56) References Cited

U.S. PATENT DOCUMENTS

| | | | | |
|---|---|---|---|---|
| 7,646,252 B2 * | 1/2010 | Banba | .......................... | 330/311 |
| 7,915,957 B2 * | 3/2011 | Nojima | ........................ | 330/286 |
| 7,936,210 B2 * | 5/2011 | Robinson et al. | ............. | 327/581 |

* cited by examiner

*Primary Examiner* — Henry Choe
(74) *Attorney, Agent, or Firm* — Iandiorio Teska & Coleman, LLP

(57) ABSTRACT

A distributed amplifier with improved stabilization includes an input transmission circuit, an output transmission circuit, at least one cascode amplifier coupled between said input and output transmission circuits. Each cascode amplifier includes a common-gate configured transistor coupled to the output transmission circuit, and a common-source configured transistor coupled between the input transmission circuit and the common-gate configured transistor. The distributed amplifier also includes a non-parasitic resistance and capacitance coupled in series between a drain and a gate of at least one of the common-gate configured transistors for increasing the amplifier stability.

15 Claims, 17 Drawing Sheets

DISTRIBUTED AMPLIFIER WITH IMPROVED STABILIZATION

RELATED APPLICATIONS

This application hereby claims the benefit of and priority to U.S. Provisional Application Ser. No. 61/464,781, filed on Mar. 9, 2011, under 35 U.S.C. §§119, 120, 363, 365, and 37 C.F.R. §1.55 and §1.78, which application is incorporated herein by reference.

FIELD OF THE INVENTION

This invention relates to an improved distributed amplifier.

BACKGROUND OF THE INVENTION

A traditional distributed amplifier is a topology well known in industry as a proven way to build a wideband amplifier. Typical bandwidths of distributed amplifiers on a GaAs substrate could be on the order of the kHz to millimeter wave frequencies. A cascode distributed amplifier is widely recognized as a way to improve gain and bandwidth over a non-cascode distributed amplifier.

The benefit of a distributed amplifier is accomplished by incorporating the parasitic effects of the transistor into the matching networks between devices. The input and output capacitances of the device can be combined with the gate and drain line inductance, respectively, to make the transmission lines virtually transparent, excluding transmission line loss. By doing this, the gain of the amplifier may only be limited by the transconductance of the device and not the parasitics associated with the device. This only happens if the signal traveling down the gate line is in phase with the signal traveling down the drain line, so that each transistor's output voltage adds in phase with the previous transistors output. The signal traveling to the output will constructively interfere so that the signal grows along the drain line. Any reverse waves will destructively interfere since these signals will not be in phase. The gate line termination is included to absorb any signals that are not coupled to the gates of the transistors. The drain line termination is included to absorb any reverse traveling waves that could destructively interfere with the output signal.

Stability of amplifiers is essential to keep a predetermined state of the circuit. A wide variety of problems arise if the amplifier is shown to oscillate or have the potential to oscillate. Problems due to oscillation can range from fluctuations in bias conditions to circuit self-destruction, etc.

Parametric oscillation is a type of oscillation that typically only occurs when certain RF power levels are applied to an amplifier, i.e., under quiescent or small conditions the amplifier appears stable.

Prior stabilizing methods have not been beneficial in preventing parametric oscillations. For example, in a cascode distributed amplifier, there is a capacitor on the gate of the common-gate (CG) device that acts to negate the Miller Capacitance which a purely common-source (CS) amplifier contains. It negates the Miller capacitance by theoretically creating an RF short at the gate node of the CG device. In many cases, this capacitor is reduced to smaller values (~0.5 pF) to tune the cascode circuit for improved power performance. This capacitor may require a resistor to De-Q the network such that it won't oscillate. Increasing this resistor value from a nominal value (e.g. 5 ohms) is a common way to enhance the stability of the circuit. This method, however, may hurt performance (i.e., provide much less bandwidth), and it may not help with parametric oscillation stability.

Another prior approach in attempting to stabilize the CG device of a cascode distributed amplifier is to introduce the loss seen by the drain in the form of a shunt resistor-capacitor (R-C) connected between the drains of the CG devices. This method, however, provides no significant reduction of parametric oscillation. For example, the CG gate resistance may actually become more negative while further degrading the gain of the amplifier.

BRIEF SUMMARY OF THE INVENTION

It is therefore an object of this invention to provide a distributed amplifier in which parametric oscillations are reduced or eliminated.

It is a further object of this invention to provide such a distributed amplifier in which the gain is not significantly degraded.

It is a further object of this invention to provide such a distributed amplifier in which the bandwidth is not significantly reduced.

The subject invention results from the realization that parametric oscillations in a distributed amplifier can be reduced or eliminated, in one embodiment, by a feedback network including a non-parasitic resistance and capacitance coupled in series between a drain and a gate of at least one of the amplifier's common-gate configured transistors.

The subject invention, however, in other embodiments, need not achieve all these objectives and the claims hereof should not be limited to structures or methods capable of achieving these objectives.

In one embodiment, the distributed amplifier with improved stabilization includes an input transmission circuit; an output transmission circuit; at least one cascode amplifier coupled between the input and output transmission circuits, each cascode amplifier including a common-gate configured transistor coupled to the output transmission circuit, and a common-source configured transistor coupled between the input transmission circuit and the common-gate configured transistor; and a feedback network including a non-parasitic resistance and capacitance coupled in series between a drain and a gate of at least one of the common-gate configured transistors for increasing the amplifier stability.

In a preferred embodiment, the drains of each of the common-gate transistors may be coupled together and the gates of each of the common-source configured transistors may be coupled together. Each cascode amplifier may further include one or more additional common-gate transistors DC-coupled between each of the common-gate configured transistors and common-source configured transistors. The resistance and the capacitance of each feedback network may include a resistor and a capacitor coupled in series across the gate and drain terminals of at least one of the one or more additional common-gate configured transistors. Each of the common-gate configured transistors may include a non-parasitic resistance and capacitance coupled between its corresponding drain and gate. There may be only one cascode amplifier coupled between the input and output transmission circuits. Each resistor may have a value of approximately 800 ohms and each capacitor may have a value of approximately 1 pF. Each resistor may have a value in a range of between 20 ohms to 10K ohms. Each capacitor may have a value in a range of between 0.1 pF to 10 pF.

In another embodiment, the distributed amplifier with improved stabilization may include an input transmission circuit; an output transmission circuit; at least two cascode amplifiers coupled between the input and output transmission circuits, each cascode amplifier including a common-gate transistor coupled to the output transmission circuit, and a common-source transistor coupled between the input transmission circuit and the common-gate transistor; and a feedback network including a resistor and capacitor coupled between a drain and a gate of at least one of the common-gate transistors for increasing the stabilization of at least one common-gate transistor.

In a preferred embodiment, each cascode amplifier may further include a second common-gate transistor coupled between the common-gate and common-source transistors. Each of the common-gate transistors may include a resistor and capacitor coupled between its corresponding drain and gate. There may be between and including four and ten cascode amplifiers coupled between the input and output transmission circuits. Each resistor may have a value of approximately 800 ohms and each capacitor may have a value of approximately 1 pF. Each resistor may have a value in the range of between 20 ohms to 10K ohms. Each capacitor may have a value in the range of between 0.1 pF to 10 pF.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DESCRIPTION OF THE INVENTION

Figure 1:
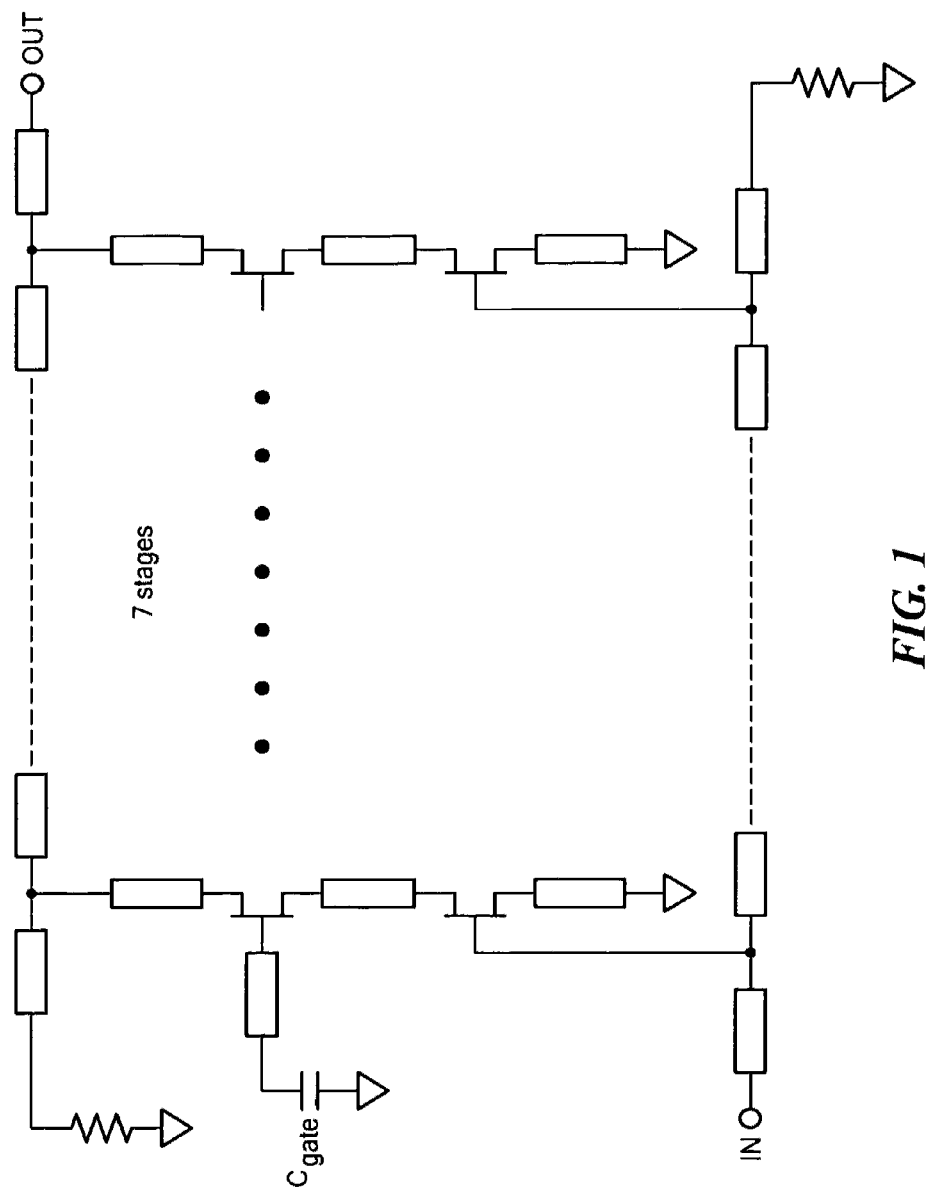
FIG. 1 is a circuit diagram of a prior art distributed amplifier.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
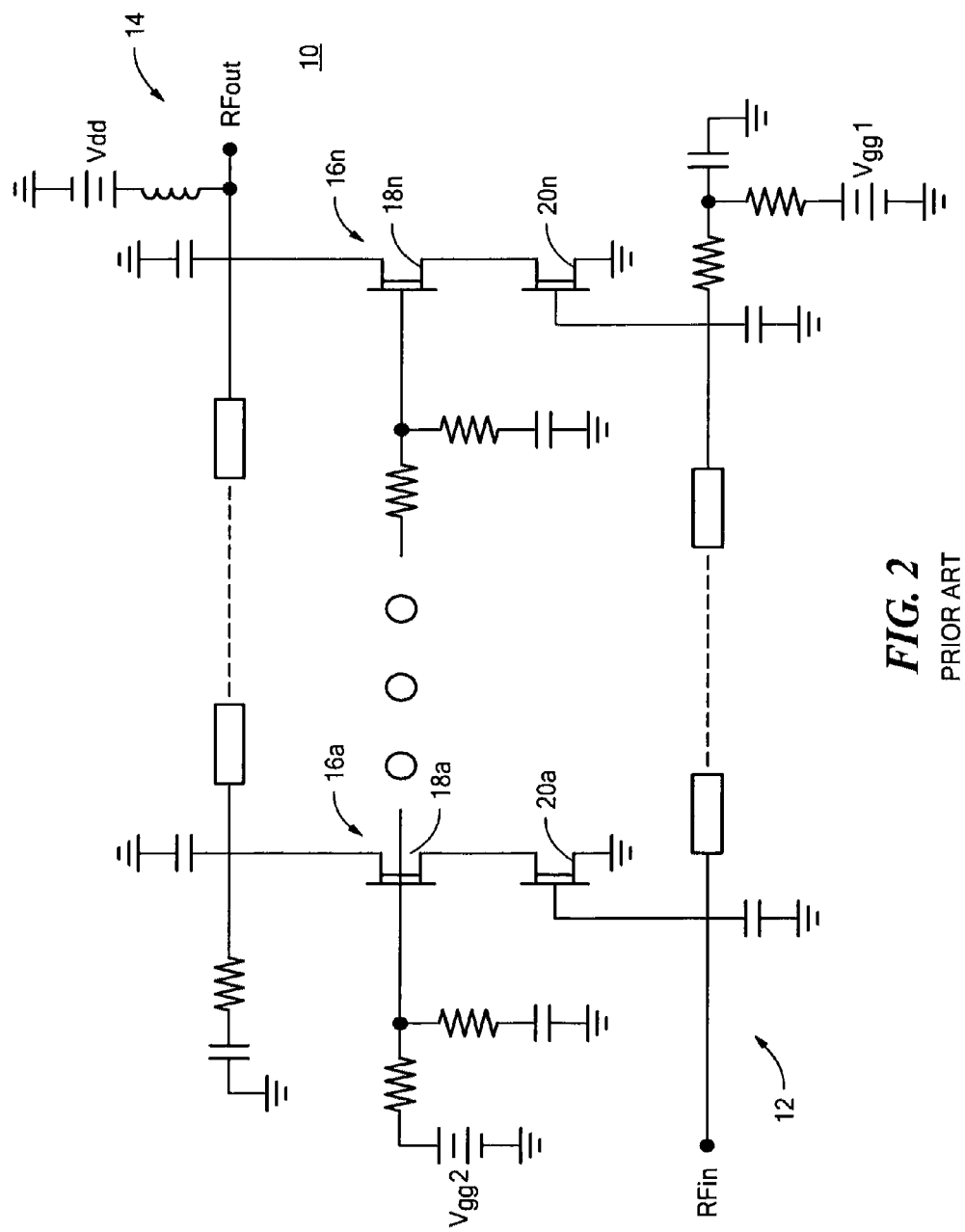
FIG. 2 is a circuit diagram of another prior art distributed amplifier.

Traditional distributed amplifiers are shown in FIGS. 1 and 2. A typical distributed amplifier 10, FIG. 2, includes an input transmission circuit 12 and an output transmission circuit 14. One or more cascode amplifiers 16a . . . 16n are coupled between input transmission circuit 12 and output transmission circuit 14. Each cascode amplifier 16a-16n typically includes a common-source (CS) transistor 18 coupled to a common-gate (CG) transistor 20 to improve gain and bandwidth by reducing the Miller Capacitance (a capacitance connected across two nodes that have inverting voltage gain) of a CS amplifier.

Figure 3A:
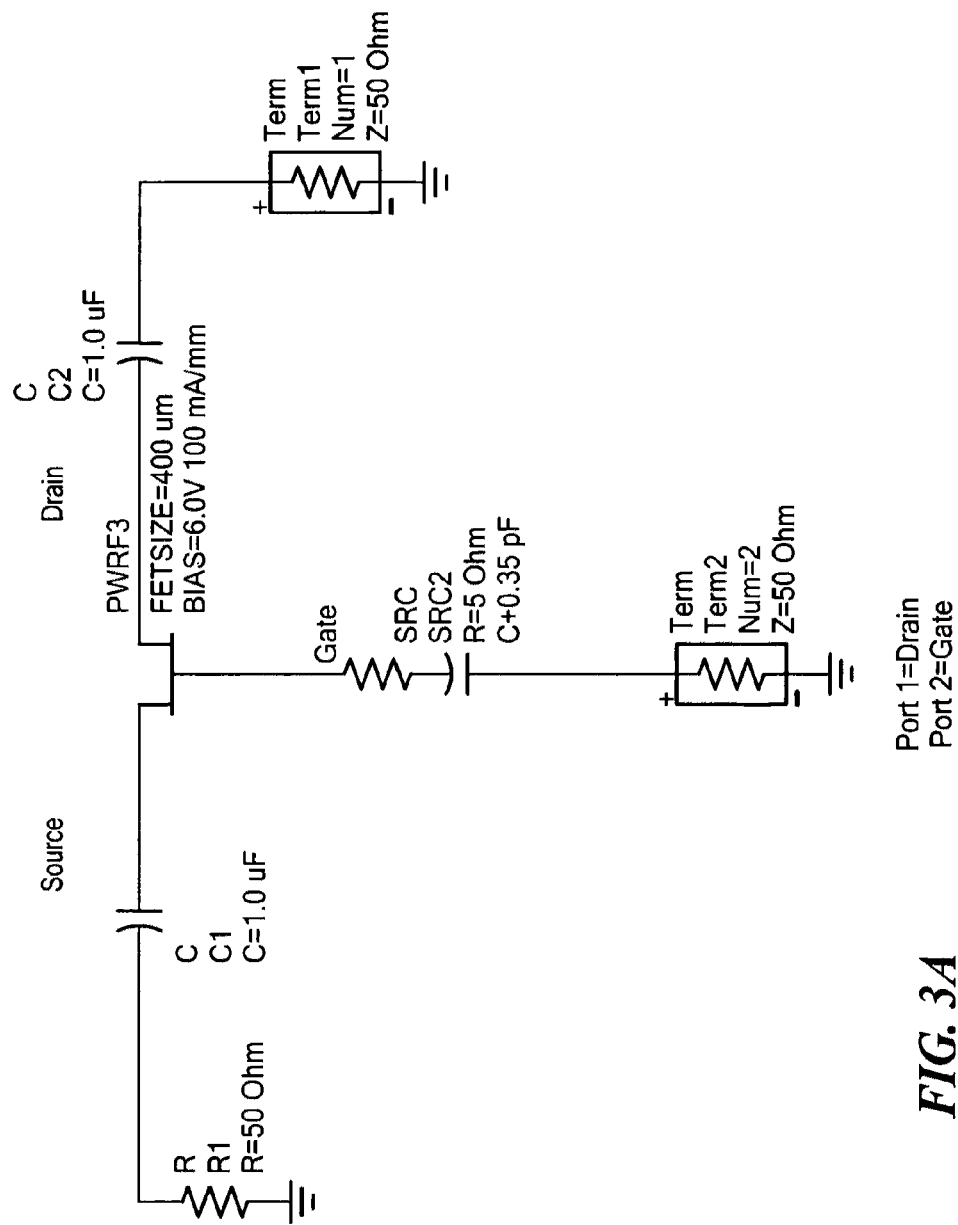
FIGS. 3A-C are a circuit diagram of the common-gate transistor of the distributed amplifier of FIG. 1 and Smith Charts showing the input and output reflection coefficients, respectively.
Figure 3B:
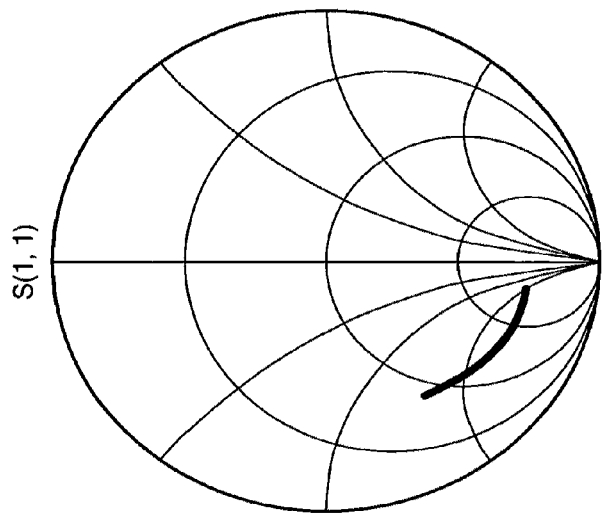
Figure 3C:
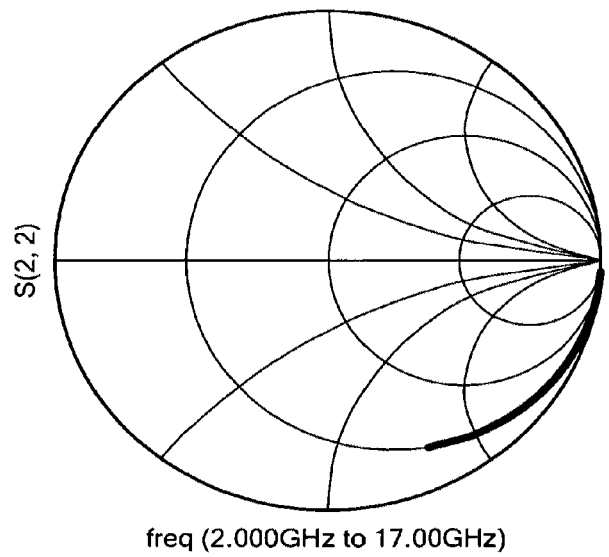

As described above, the stability of amplifiers is essential to keep a predetermined state of the circuit. A wide variety of problems arise if the amplifier is shown to oscillate or have the potential to oscillate. Problems due to oscillation can range from fluctuations in bias conditions to circuit self-destruction, etc. Cascode distributed amplifiers are shown to be prone to oscillations due to the output impedance of the common-gate being negative under normal conditions as shown in FIGS. 3A-C. That is, a typical GaAs transistor when connected in a common-gate configuration (gate node coupled to ground) can show a positive reflection coefficient at certain frequencies as shown in the Smith Chart of FIG. 3C. A positive reflection is a potential problem as it has the ability to help grow and sustain an oscillation.

Parametric oscillations are typically oscillations that only occur when RF power is applied to the amplifier, i.e. under DC conditions, the amplifier appears stable.

Figure 4:
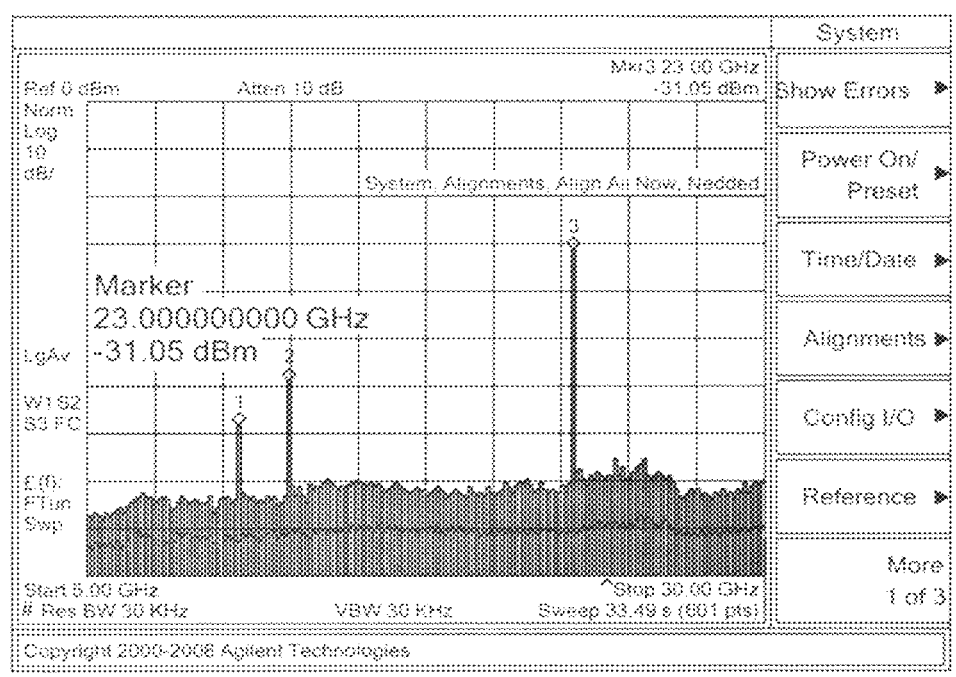
FIG. 4 is a plot showing typical parametric oscillation of a distributed amplifier.

Parametric oscillations typically occur at half of the fundamental frequency of operation. The oscillation can also be shown to split into two oscillations occurring at 2 different frequencies with the same relative delta in frequency from half of the fundamental frequency e.g. if fo=16 GHz then fo/2=8 GHz (oscillations could occur at 7 and 9 GHz). An example measurement of a parametric oscillation is shown in FIG. 4. The oscillation occurs only under drive due to the transistor device parameters changing under applied RF power. For example capacitances (such as the gate to source capacitance Cgs) will most likely increase as drive level increases towards power compression. This can also be seen by the transistor drain current increasing under drive. Since the current is changing, it is reasonable to believe the device characteristics are changing.

Figure 5A:
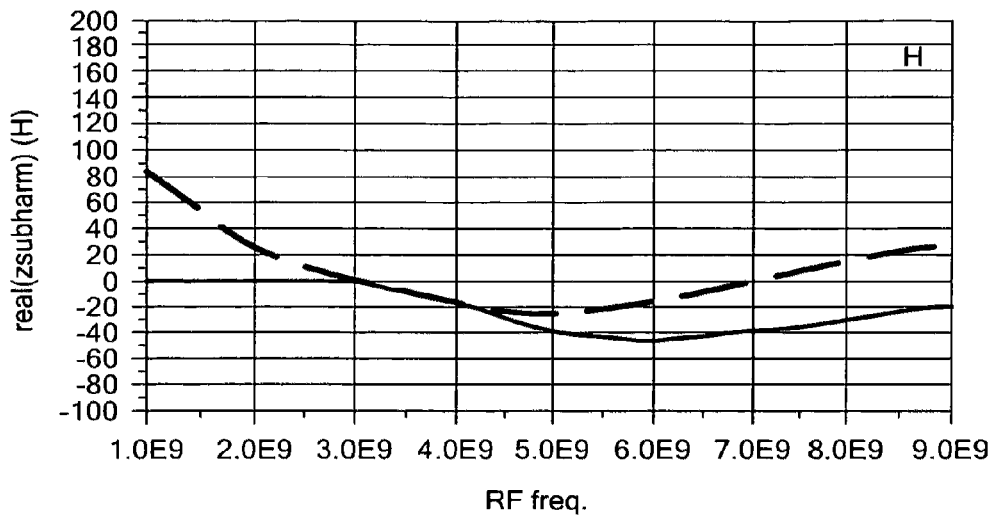
FIGS. 5A-B are plots showing simulated S-Parameters and CG node gate resistance, respectively, with and without an additional stability resistor in series with gate on the CG transistor of a DC-6 GHz distributed amplifier.
Figure 5B:
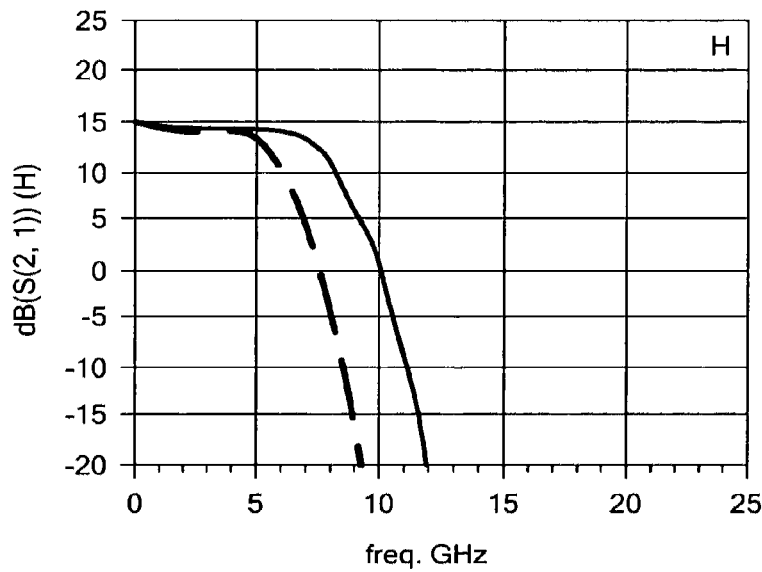

As described above, prior stabilizing methods have not been beneficial in preventing parametric oscillations. For example, in a cascode distributed amplifier, there is a capacitor on the gate of the common-gate (CG) device that acts to negate the Miller Capacitance which a purely common-source (CS) amplifier contains. It negates the Miller capacitance by theoretically creating an RF short at the gate node of the CG device. In many cases, this capacitor is reduced to smaller values (~0.5 pF) to tune the cascode circuit for improved power performance. This capacitor may require a resistor to De-Q the network such that it won't oscillate. Increasing this resistor value from a nominal value (e.g. 5 ohms) is a common way to enhance the stability of the circuit. This method, however, may hurt performance (i.e., provide much less bandwidth), and as can be seen in FIGS. 5A-B, it does not help with parametric oscillation stability.

Figure 6A:
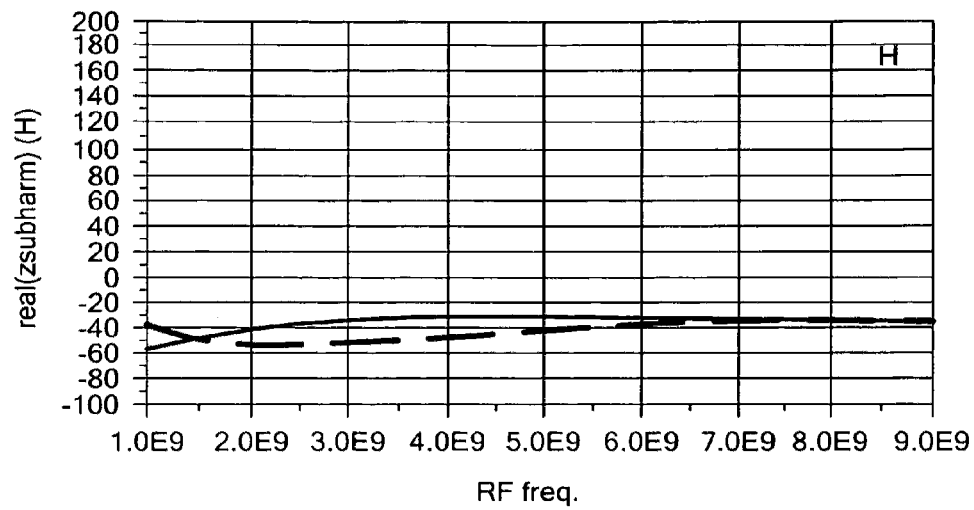
FIGS. 6A-B are plots showing simulated S-Parameters and CG node gate resistance, respectively, with and without a shunt R-C in between drains of CG devices of a DC-6 GHz distributed amplifier.
Figure 6B:
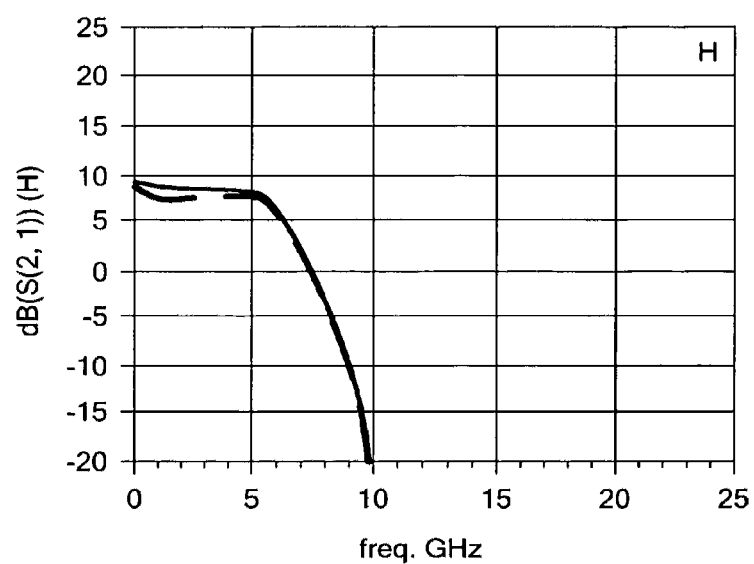

Another prior approach in attempting to stabilize the CG device of a cascode distributed amplifier is to introduce the loss seen by the drain in the form of a shunt resistor-capacitor (R-C) connected between the drains of the CG devices. This method, however, provides no significant reduction of parametric oscillation. It can be seen from FIGS. 6A-B that the CG gate resistance actually becomes more negative while further degrading the gain of the amplifier.

In narrowband amplifiers, it can be shown that parametric oscillations can be reduced or eliminated by introducing loss selectively at frequencies lower then the band of operation without significantly degrading amplifier performance. This works because the parametric oscillation typically occurs at half the fundamental frequency of operation. The loss can be introduced selectively by including a high pass filter in series with the amplifier, with a cutoff frequency below the band of interest such that in the band of interest the loss is minimal. Another method for narrowband circuits is to introduce a subharmonic trap, i.e. an inductor-capacitor resonant circuit which is designed to only introduce loss at the subharmonic frequency.

Wideband circuits such as a distributed amplifier are more difficult to stabilize, however, because introducing loss will possibly degrade the entire frequency response in terms of gain and power. It is preferable to find a way to introduce loss in the amplifier to reduce the parametric oscillation without significantly degrading the amplifier performance.

Figure 7:
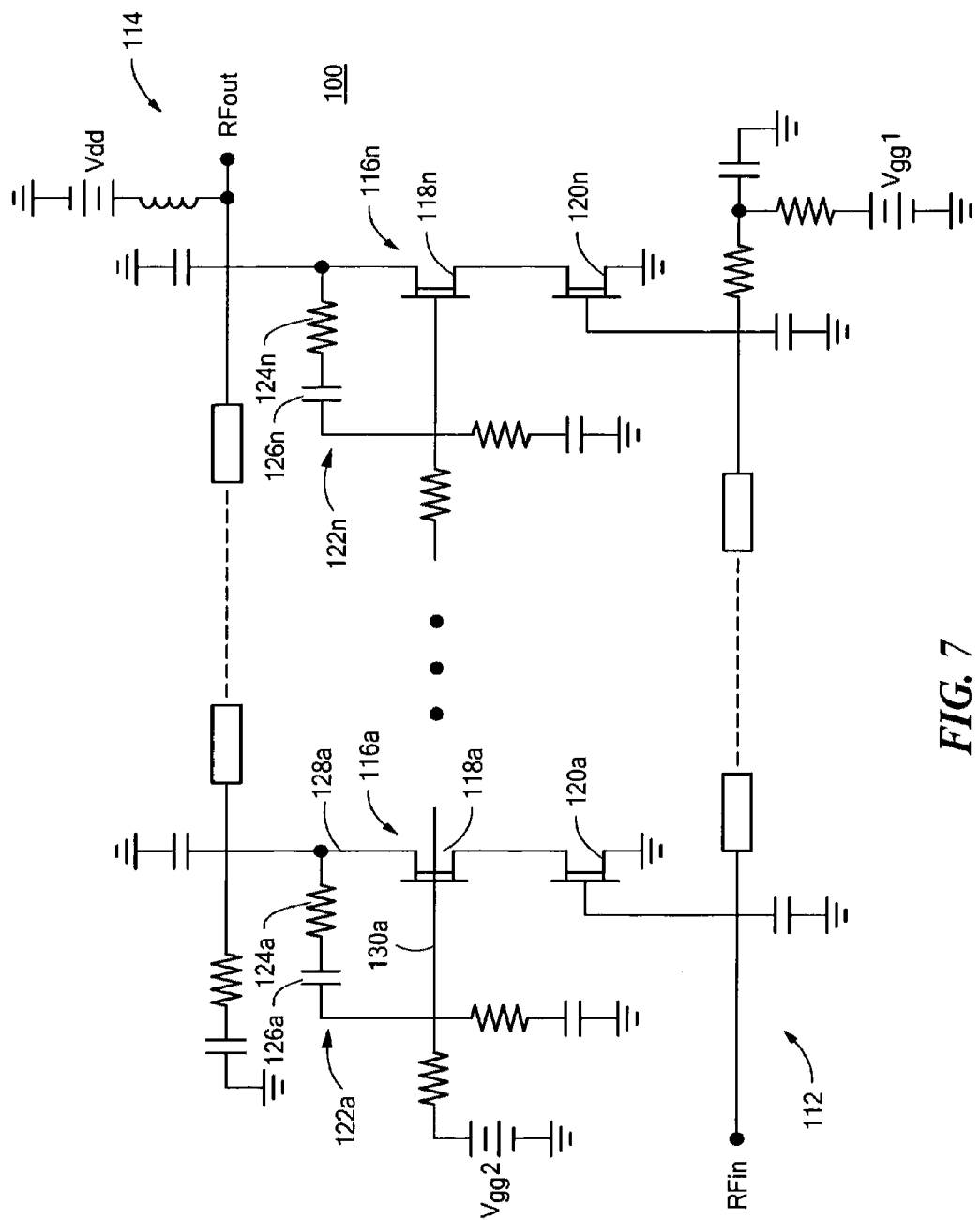
FIG. 7 is a circuit diagram of a distributed amplifier in accordance with one embodiment of the subject invention.
Figure 8A:
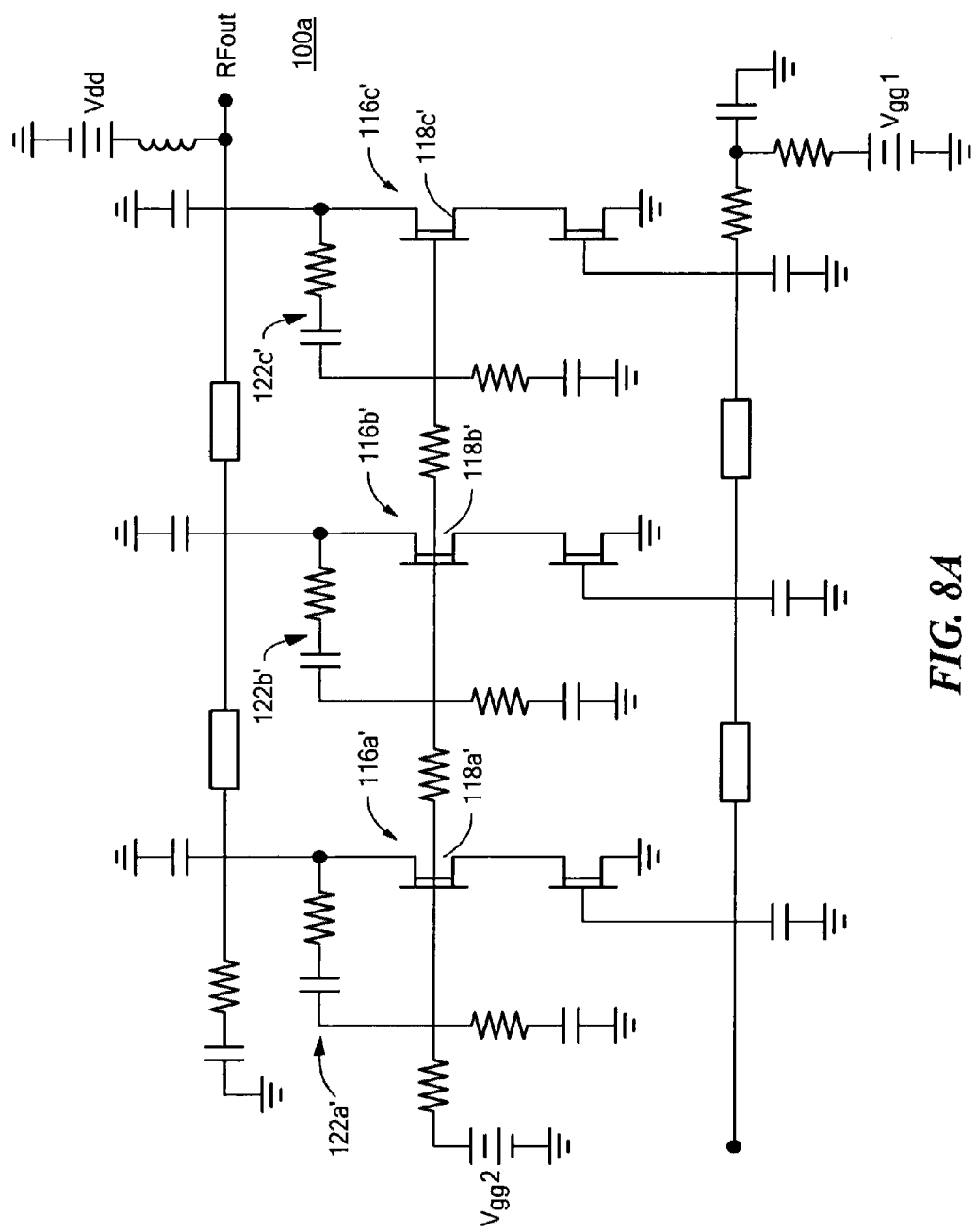
FIG. 8A is a circuit diagram of the distributed amplifier of FIG. 7 in which the distributed amplifier includes three stages.

In accordance with one aspect of the invention a distributed amplifier 100, FIG. 7, includes an input transmission circuit 112 and an output transmission circuit 114. At least one cascode amplifier 116*a* . . . 116*n* is coupled between input and output transmission circuits 112 and 114. Cascode amplifier 116*a*, for example, includes a common-gate (CG) configured transistor 118*a* coupled to output transmission circuit 114, and a common-source (CS) configured transistor 120*a* coupled between input transmission circuit 112 and CG configured transistor 118*a*. A feedback network 122*a*, which may include a selectively chosen, non-parasitic resistance and capacitance such as a resistor 124*a* and a capacitor 126*a*, is coupled across a drain 128*a* and a gate 130*a* of at least one of the CG configured transistors for increasing the stabilization of the at least one transistor. Only some of transistors 118*a* . . . 118*n* may include a similar feedback network 122*a* . . . *n*, or all of transistors 118*a* . . . 118*n* may include a similar feedback network 122*a* . . . *n* as shown in FIGS. 7, 8A, and 8B.

Each resistor 124*a* . . . 124*n* may have a value in a range of between 20 ohms to 10K ohms. Each capacitor 126*a* . . . 126*n* may have a value in a range of between 0.1 pF to 10 pF. More preferably, each resistor 124*a* . . . 124*n* may have a value of approximately 800 ohms and each capacitor 126*a* . . . 126*n* may have a value of approximately 1 pF.

Each CG configured transistor 118*a* includes a common-gate transistor, and each CS configured transistor 120*a* includes a common-source transistor. The distributed amplifier 100*a*, FIG. 8A, may include three stages 116*a'*-116*c'*, or slices, of cascode amplifiers in which one or more of CG configured transistors 118*a'*, 118*b'*, and/or 118*c'* includes a feedback network 122*a'*, 122*b'*, and/or 122*c'* coupled across the corresponding drain and Elate of each corresponding CG transistor. The number of cascode amplifiers 116*a* . . . 116*n* coupled between the input and output transmission circuits 112 and 114 is typically between and including four and ten, although more or less cascode amplifiers may be used. For example, eleven or twelve cascode amplifiers may be coupled between input and output transmission circuits 112 and 114 depending on the application.

Figure 8B:
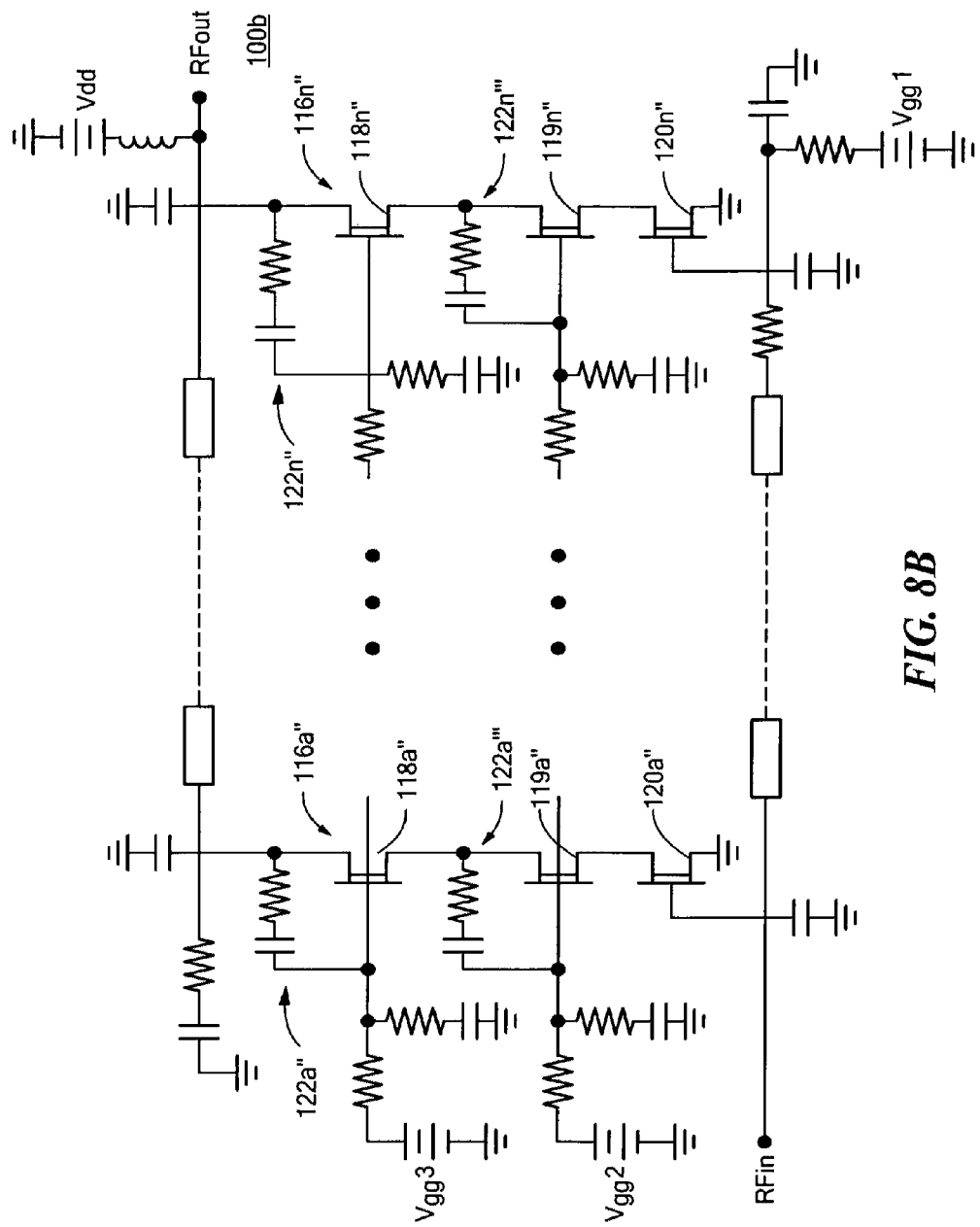
FIG. 8B is a circuit diagram of another embodiment of the distributed amplifier of FIG. 7 in which the distributed amplifier is triple stacked.

The distributed amplifier 100*b*, FIG. 8B, may also include, for example, a triple stack distributed amplifier in which each cascode amplifier 116*a"* . . . 116*n"* each includes two common-gate transistors and a common-source transistor. Higher levels of stacking with more common-gate transistors coupled in series may also be used. To enhance stability, feedback networks 122*a"* . . . 122*n"* and 122*a'''* . . . 122*n'''* similar to the ones described above may be connected between the drain and gate electrodes of one or more of the common-gate transistors.

Figure 9A:
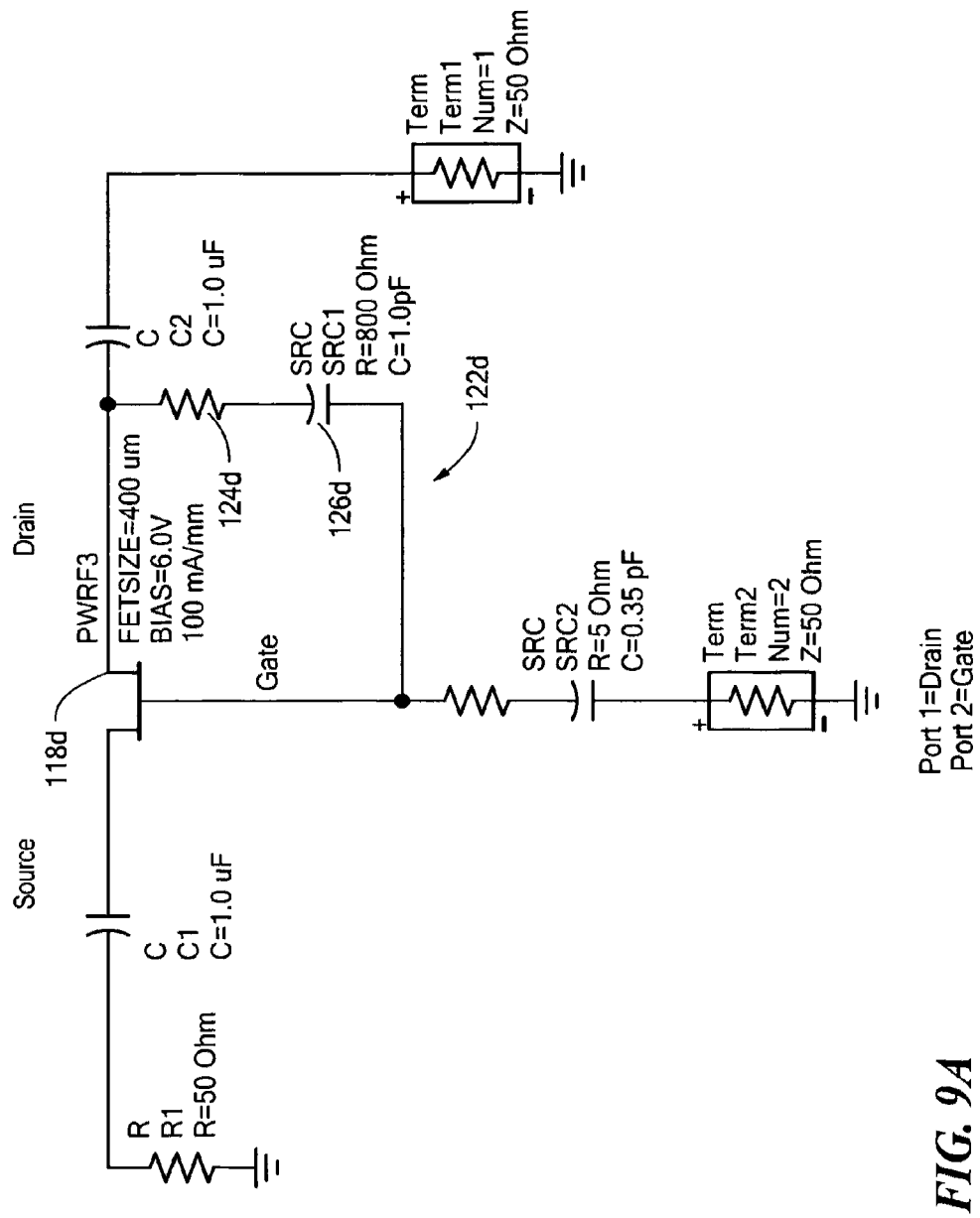
FIGS. 9A-C are a circuit diagram of the common-gate transistor of the distributed amplifier of FIG. 7 and Smith Charts showing the input and output reflection coefficients, respectively with and without a feedback network.
Figure 9B:
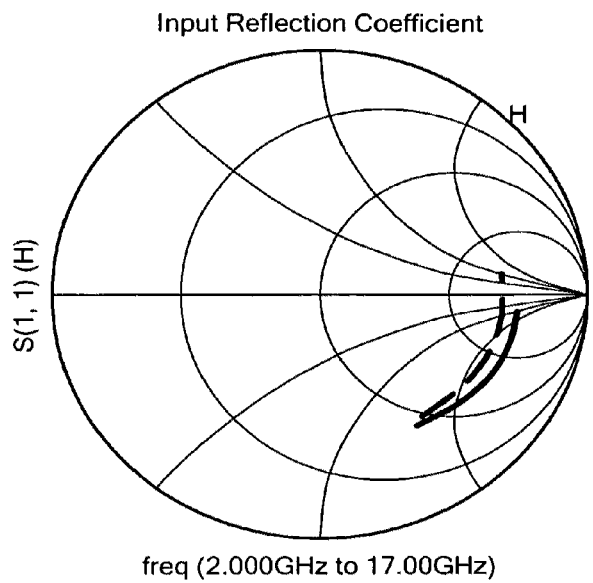
Figure 9C:
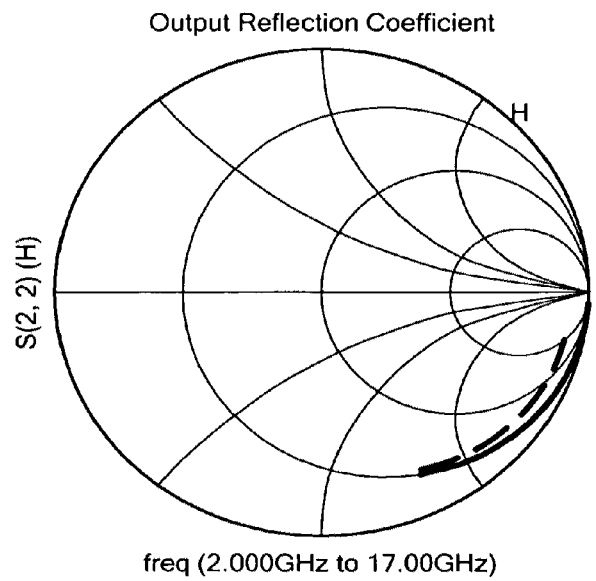

In FIG. 9A, some nominal values have been included for feedback network 122*d* and other components (used to isolate Miller Capacitance in cascode and tune for RF Power, output return loss, etc.) that a CG transistor would have in its common configuration of a cascode distributed amplifier. For example, feedback network 122*d* includes a 800 ohm resistor 124*d* and a 1.0 pF capacitor 126*d*. It can be seen in FIGS. 9B-C when looking at the CG transistor with the R-C feedback network (dashed line) added that the gate reflection coefficient has been improved significantly (less unstable) in comparison to an unstabilized transistor shown by the solid line.

Figure 10A:
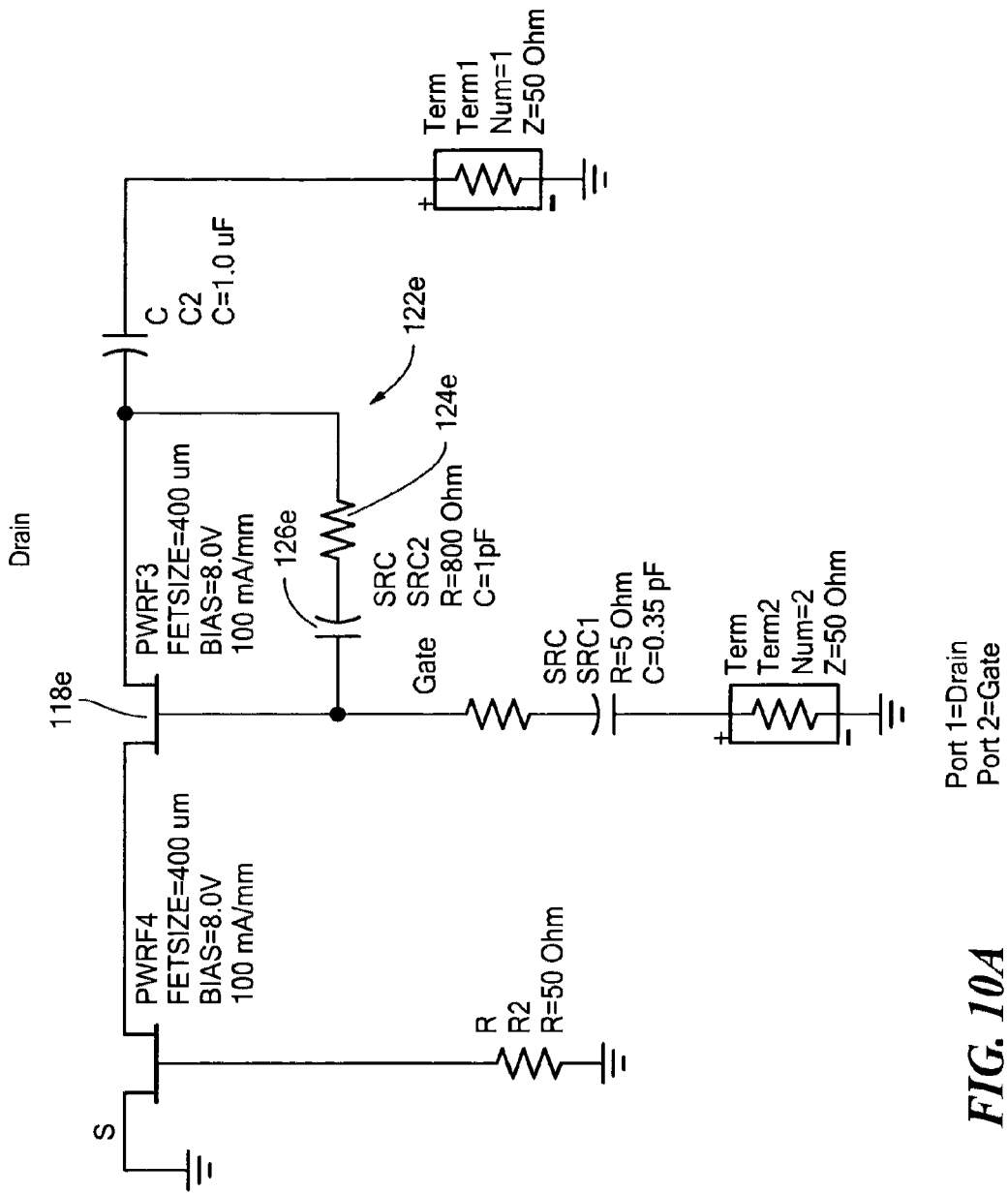
FIGS. 10A-C are a circuit diagram of the cascode amplifier of the distributed amplifier of FIG. 7 and Smith Charts showing the input and output reflection coefficients, respectively.
Figure 10B:
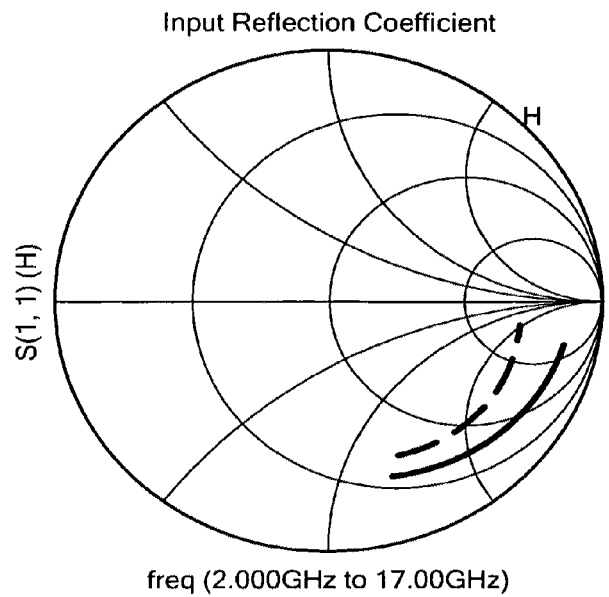
Figure 10C:
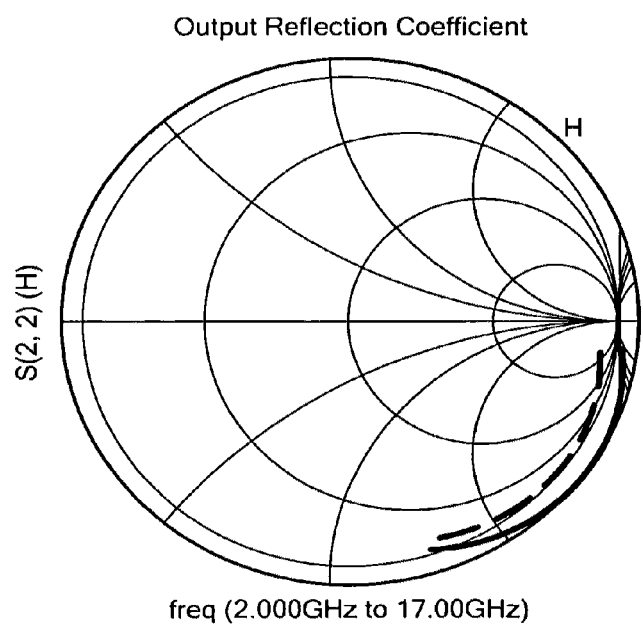

Incorporating the CG device of FIG. 9A into the cascode configuration which is typical in a Cascode Distributed amplifier is shown in FIG. 10A. Again, nominal values of 800 ohms for resistor 124*e* and 1 pF for capacitor 126*e* are used for the feedback network 122*e* on the gate. It can be seen from the Smith Chart in FIG. 10C which is the impedance looking into the gate of the CG device that the resistance is negative without the R-C stability (solid line) and is brought less negative with a feedback network including 800 ohms of a stability resistance (dashed line).

To further improve the stability of the circuit, the size of the feedback resistor may be reduced to 500 or 600 ohms. To be able to kill a parametric oscillation in an amplifier without degrading the overall performance, the impedance is preferably seen at every node of the circuit at small signal conditions and under applied RF power. Often, the resistance of a node will change between small signal conditions and under applied RF power. It is preferable to satisfy small signal stability in additional to large signal stability for an amplifier to be considered stable. The conditions for oscillation are a negative resistance, which in turn will create a positive reflection coefficient, as well as a 0 or 360 degree loop phase shift. A positive reflection coefficient has the ability to create a loop gain of 1 and combined with a phase shift of 0 or 360 degrees around that loop will likely create an oscillation.

Figure 11:
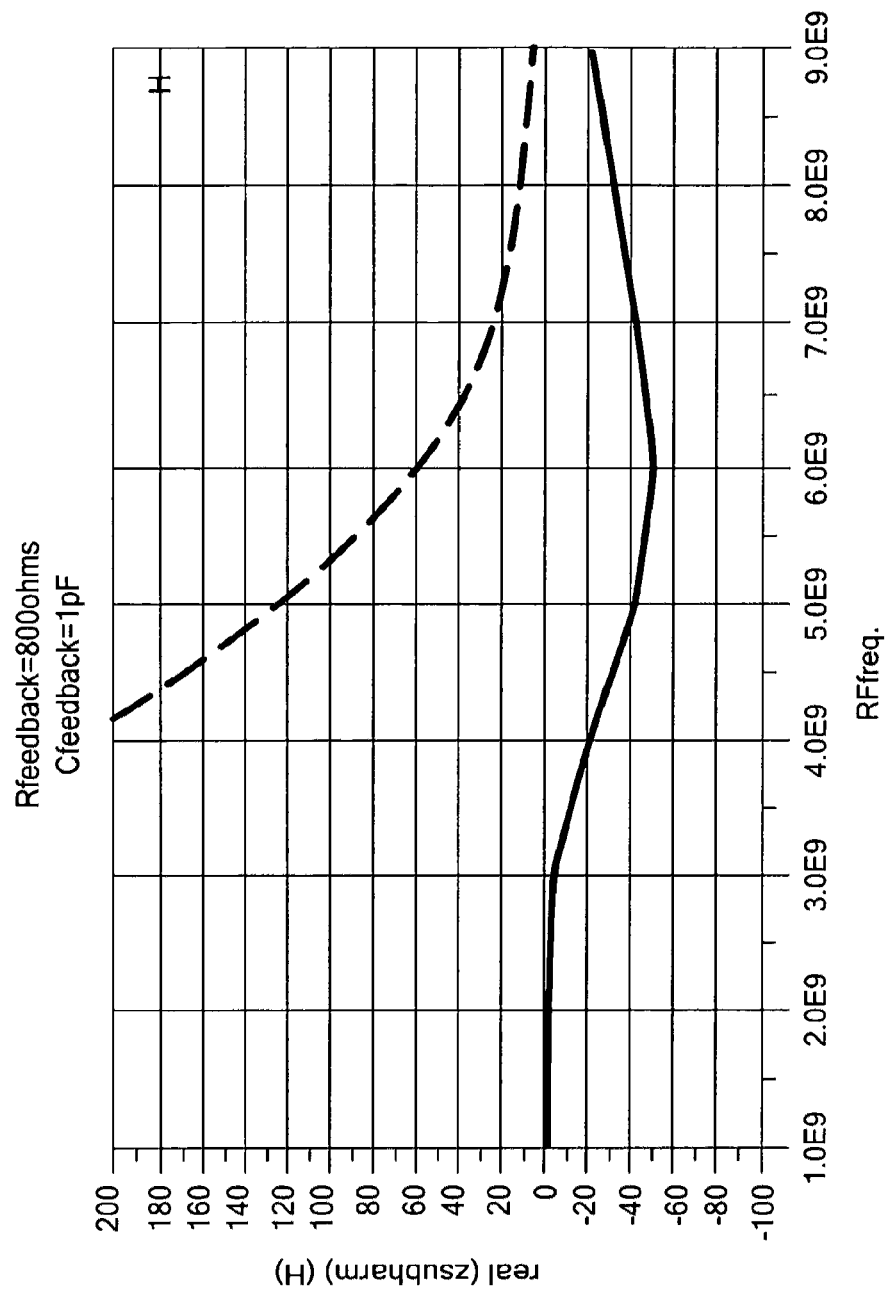
FIG. 11 is a plot showing simulated CG node gate impedance and S-parameters with and without a feedback network for a DC-6 GHz distributed amplifier.
Figure 12A:
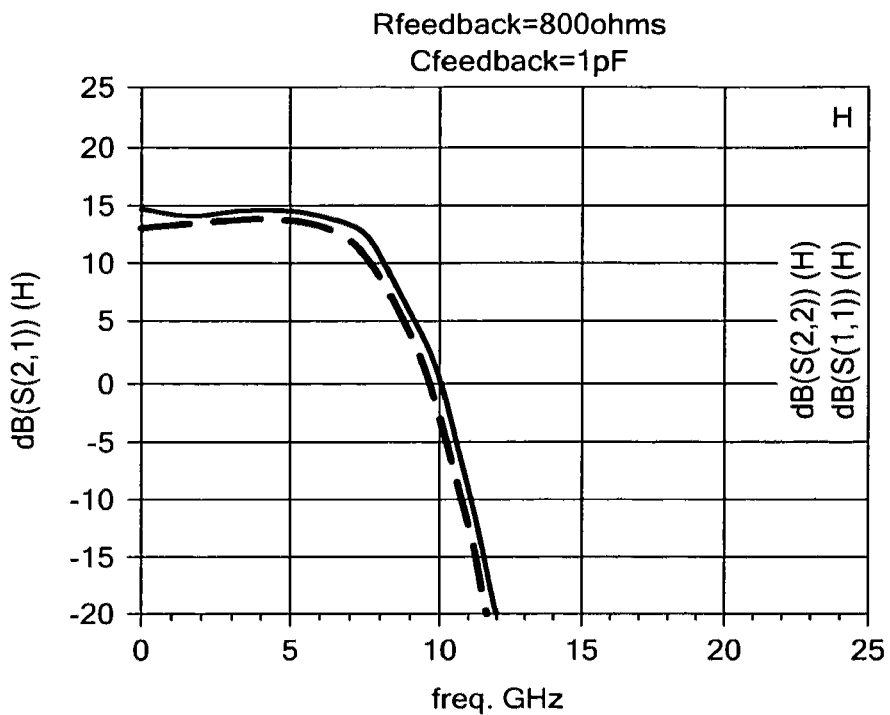
FIGS. 12A-B are plots showing simulated S-Parameters with and without a feedback network on CG transistor of a DC-6 GHz distributed amplifier.
Figure 12B:
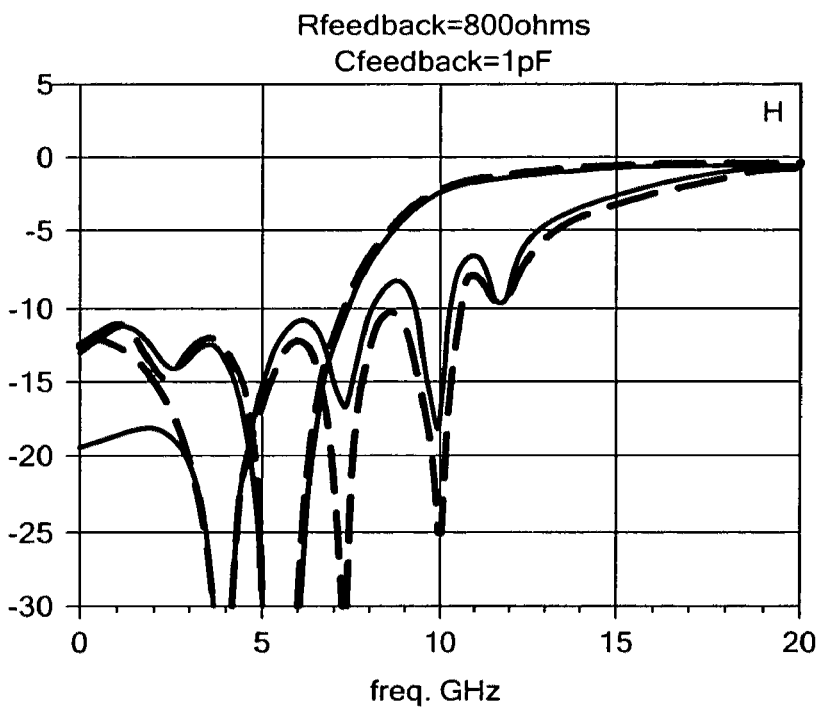
Figure 13:
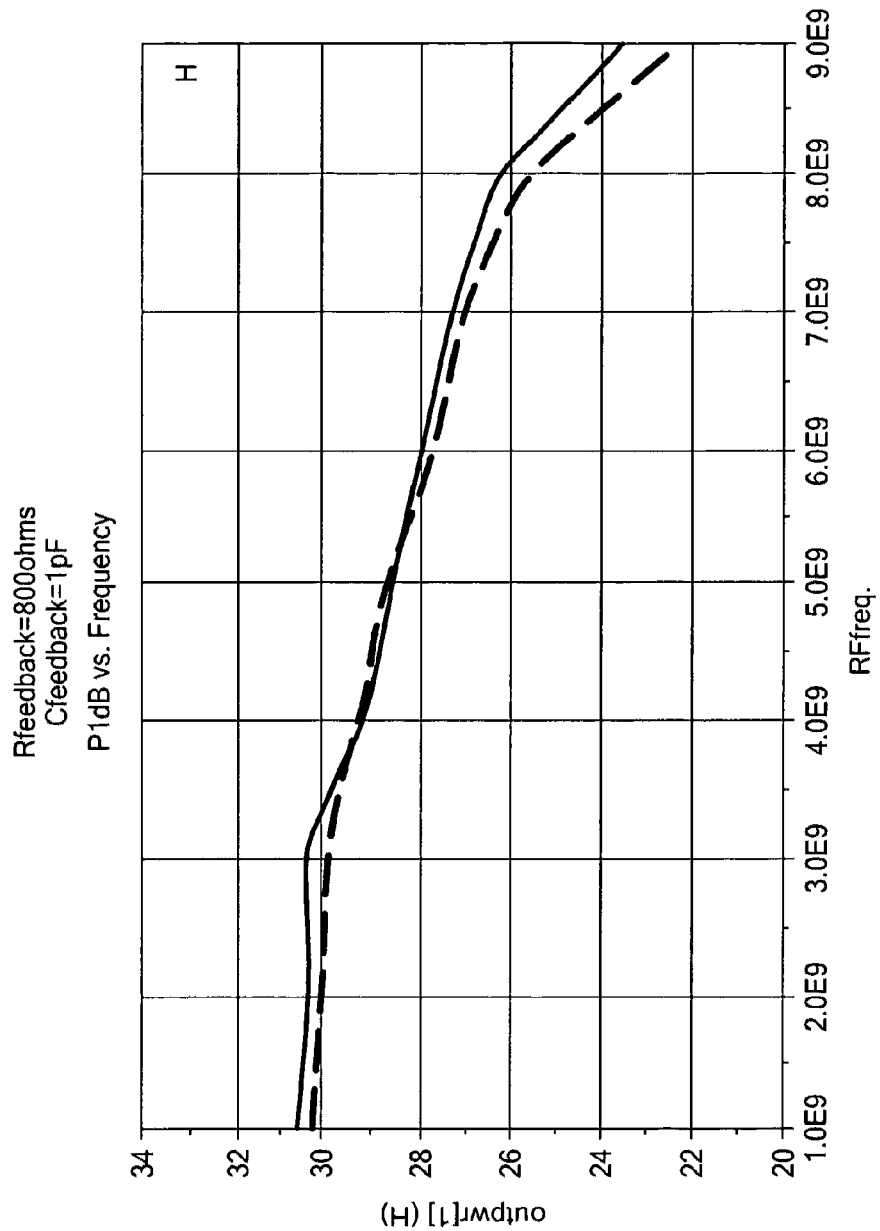
FIG. 13 is a plot showing simulated power with and without a feedback network on CG transistor of a DC-6 GHz distributed amplifier.

In FIG. 11, a simulation is shown of the CG transistor's gate node resistance in a DC-6 GHz distributed amplifier with (dashed line) and without (solid line), a feedback network on the CG transistor from drain to gate. Specifically, this plot shows the real pan of the complex impedance that is the summation of the impedances looking to the left and right of the probe at that node. The x-axis of the FIG. 11 plot is actually the fundamental frequency but the trace is the resistance at half of the fundamental frequency, or subharmonic frequency. Here the feedback network resistor value is 800 ohms and the Capacitor value is 1 pF. In this example, the purpose of the capacitor is mainly to block DC current from drain to gate. It can be seen from FIG. 11 that at 3 GHz without the feedback network, the gate resistance is on the order of 0 ohms (solid line), which is dangerously close to being negative and at some frequencies does turn negative. However, with the feedback network added (dashed line), the resistance is greater then 200 ohms with very little degradation in S21 or return loss as seen in FIGS. 12A-B. At the upper edge of the band, the gate resistance is coming towards 20 ohms even with the feedback network. This can be further improved by reducing the feedback resistor or perhaps using the feedback network in conjunction with another stabilizing method, such as a small series resistance on the gate itself. However, at the band edge of 6 GHz, without adding an additional stabilizing method, the real part of the resistance is greater then 20 ohms, a fairly safe operating margin. It is apparent that a huge benefit has been made in the stability of the circuit without a severe degradation in gain or return loss (see FIGS. 12A and 12B). It is also shown that in FIG. 13 there is little degradation in power due to this stabilizing network.

The subject invention can stabilize a cascode distributed amplifier in terms of a parametric oscillation without significantly degrading amplifier performance. In addition, this will help small signal stability. This technique could be applied to any Common-Gate transistor used in a distributed amplifier topology. That is, there could be a cascade of two CG transistors, or a triple stack distributed amplifier, as shown in FIG. 8B. Additionally, this stabilization could apply to single cascode amplifier, as opposed to string of cascode amplifiers in a distributed amplifier.

Thus, it is to be understood that the invention is not limited in its application to the details of construction and the arrangements of components set forth in the preceding description or illustrated in the drawings. If only one embodiment is described herein, the subject invention is not to be limited to that embodiment. For example, bipolar (BJT) transistors could be used instead of FETs with base, collector, and emitter electrode designations. Moreover, scope of the subject invention is not to be read restrictively unless there is clear and convincing evidence manifesting a certain exclusion, restriction, or disclaimer.

Although specific features of the invention are shown in some drawings and not in others, this is for convenience only as each feature may be combined with any or all of the other features in accordance with the invention. The words "including", "comprising", "having", "coupled", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A distributed amplifier with improved stabilization, comprising:
    an input transmission circuit;
    an output transmission circuit;
    at least one cascode amplifier coupled between said input and output transmission circuits, each cascode amplifier including a common-gate configured transistor coupled to the output transmission circuit, and a common-source configured transistor coupled between the input transmission circuit and the common-gate configured transistor, each cascode amplifier further including one or more additional common-gate transistors DC-coupled between each of the common-gate configured transistors and common-source configured transistors; and
    an amplifier stability a feedback network including a non-parasitic resistance and capacitance coupled in series between a drain and a gate of at least one of the common-gate configured transistors for increasing the amplifier stability.

2. The distributed amplifier of claim 1 in which the drains of each of the common-gate transistors are coupled together and the gates of each of the common-source configured transistors are coupled together.

3. The distributed amplifier of claim 1 in which the resistance and the capacitance of each feedback network includes a resistor and a capacitor coupled in series across the gate and drain terminals of at least one of the one or more additional common-gate configured transistors.

4. The distributed amplifier of claim 3 in which each resistor has a value of approximately 800 ohms and each capacitor has a value of approximately 1 pF.

5. The distributed amplifier of claim 3 in which each resistor has a value in a range of between 20 ohms to 10K ohms.

6. The distributed amplifier of claim 3 in which each capacitor has a value in a range of between 0.1 pF to 10 pF.

7. The distributed amplifier of claim 1 in which each of the common-gate configured transistors include a non-parasitic resistance and capacitance coupled between its corresponding drain and gate.

8. The distributed amplifier of claim 1 in which there is only one cascode amplifier coupled between said input and output transmission circuits.

9. A distributed amplifier with improved stabilization, comprising:
    an input transmission circuit;
    an output transmission circuit;
        at least two cascode amplifiers coupled between said input and output transmission circuits, each cascode amplifier including a common-gate transistor coupled to the output transmission circuit, and a common-source transistor coupled between the input transmission circuit and the common-gate transistor; and
    a feedback network including a resistor and capacitor coupled between a drain and a gate of at least one of the common-gate transistors for increasing the stabilization of at least one common-gate transistor.

10. The distributed amplifier of claim 9 in which each cascode amplifier further includes a second common-gate transistor coupled between the common-gate and common-source transistors.

11. The distributed amplifier of claim 9 in which each of the common-gate transistors include a resistor and capacitor coupled between its corresponding drain and gate.

12. The distributed amplifier of claim 9 in which there are between and including four and ten cascode amplifiers coupled between said input and output transmission circuits.

13. The distributed amplifier of claim 9 in which each resistor has a value of approximately 800 ohms and each capacitor has a value of approximately 1 pF.

14. The distributed amplifier of claim 9 in which each resistor has a value in a range of between 20 ohms to 10K ohms.

15. The distributed amplifier of claim 9 in which each capacitor has a value in a range of between 0.1 pF to 10 pF.

\* \* \* \* \*